United States Patent [19]

Lee

[11] Patent Number: 5,676,199
[45] Date of Patent: Oct. 14, 1997

[54] THERMOSTAT CONTROLLED COOLER FOR A CPU

[76] Inventor: Richard M. L. Lee, 8F-6, No. 100, Sec. 2, Hoping E. Road, Taipei, Taiwan

[21] Appl. No.: 561,730

[22] Filed: Nov. 22, 1995

Related U.S. Application Data

[63] Continuation-in-part of Ser. No. 95,379, Jul. 23, 1993, abandoned.

[51] Int. Cl.$^6$ ............................................. H05H 7/20
[52] U.S. Cl. ........................ 165/80.3; 165/299; 257/719
[58] Field of Search ........................... 165/80.3, 185, 165/121, 299; 257/718, 719, 722; 174/16.3; 361/697, 704; 62/3.2, 259.2

[56] References Cited

U.S. PATENT DOCUMENTS 5,287,249  2/1994  Chen ................................. 165/185 X
5,457,342  10/1995  Herbst, II ......................... 361/697 X

*Primary Examiner*—John Fox

[57] ABSTRACT

A thermostat controlled cooler is described which includes a supporting frame attached to a CPU. A heat exchanger is also attached to the supporting frame. This heat exchanger includes a plurality of heat exchange fins. A heat actuating cooling chip is sandwiched between the CPU and the heat exchanger, and an electrical cooling fan is disposed above the heat exchange fins of the heat exchanger. A control circuit is attached to a side of the electrical cooling fan, and a thermostat sensor is electrically connected to the control circuit. This thermostatic sensor is inserted into a space defined by two adjacent heat exchange fins. When the temperature at the heat exchange fins exceeds a pre-setting, the cooling fan will be actuated to remove the heat by ventilation.

3 Claims, 11 Drawing Sheets

5,676,199

THERMOSTAT CONTROLLED COOLER FOR A CPU

This application is a continuation-in-part of application Ser. No. 08/095,379 filed Jul. 23, 1993, now abandoned.

FIELD OF THE INVENTION

This invention relates to a cooler, and more particularly, to a thermostatically controlled cooler for a central processing unit.

In an integral circuit or a mother board in a personal computer, the main factors which may bring a negative effect on the central processing unit (hereinafter referred as CPU) are the temperature and humidity in the ambient environment. If the ambient temperature is too high for the operation of a CPU, then a variation of the characteristics of a CPU may appear. In an advanced CPU, the clock speed is very fast, and only at a high speed, can a great deal of data be processed within a short period of time. Consequently, a comparable high heat will be generated by the circuit. If the heat build-up on the CPU is not reduced properly, the CPU may be damaged causing an irreversible malfunction of the computer.

In order to remove the heat generated by the circuits, a thermostatically controlled air conditioner or suitable ventilating instrument is provided in a computer room to keep the environment, i.e. temperature and humidity, stable. In a controlled environment, an efficient heat exchange makes the CPU run functionally.

SUMMARY OF THE INVENTION

It is an object of this invention to provide a thermostatically controlled cooler which can efficiently remove the heat build-up in a CPU and make it run, functionally preventing any malfunction caused by the build-up of heat.

It is another object of this invention to provide a thermostatically controlled cooler which actuates an electric fan as the temperature on the surface reaches a predetermined level.

In order to achieve the goal set forth, the cooler according to this invention comprises a supporting frame which can be attached to a CPU. A heat exchange means is attached to the supporting frame. The heat exchange means further comprises a plurality of heat exchange fins. A heat actuating cooling chip is sandwiched between the CPU and the heat exchange means. An electrical cooling fan is disposed above the heat exchange fins on said heat exchange means. A control circuit is attached in a suitable position on said electric cooling fan. A thermostat sensor is electrically connected to said control circuit. This thermostat sensor is inserted into a space defined by two adjacent heat exchange fins. As the temperature of said heat exchange fins exceed a pre-setting, said cooling fan will be actuated to remove the heat by ventilation.

BRIEF DESCRIPTION OF THE DRAWINGS

The structural and operational characteristics of the present invention and its advantages as compared to the known state of the prior art will be better understood from the following description, relating to the attached drawings which show illustratively but not restrictively an example of the thermostatically controlled cooler of this invention. In the drawings.

DESCRIPTION OF A PREFERABLE EMBODIMENT

Figure 1:
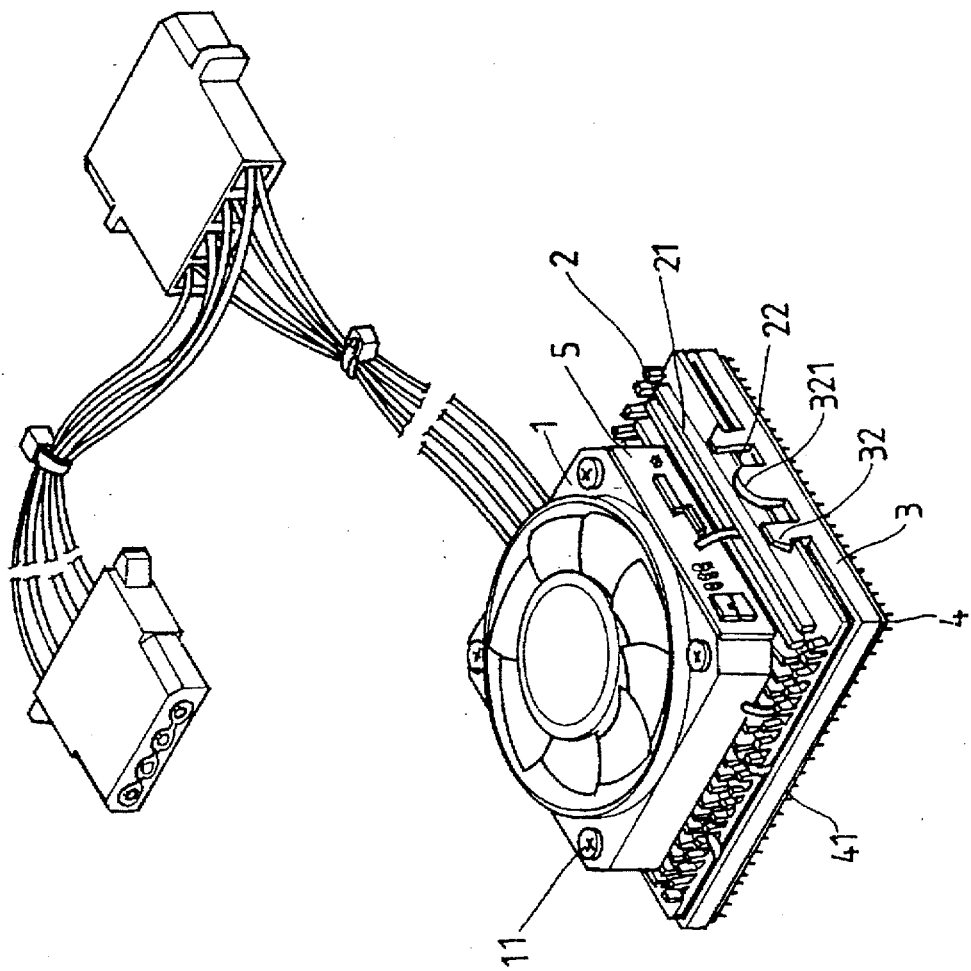
FIG. 1 is a perspective view of a cooler made according to this invention.
Figure 2:
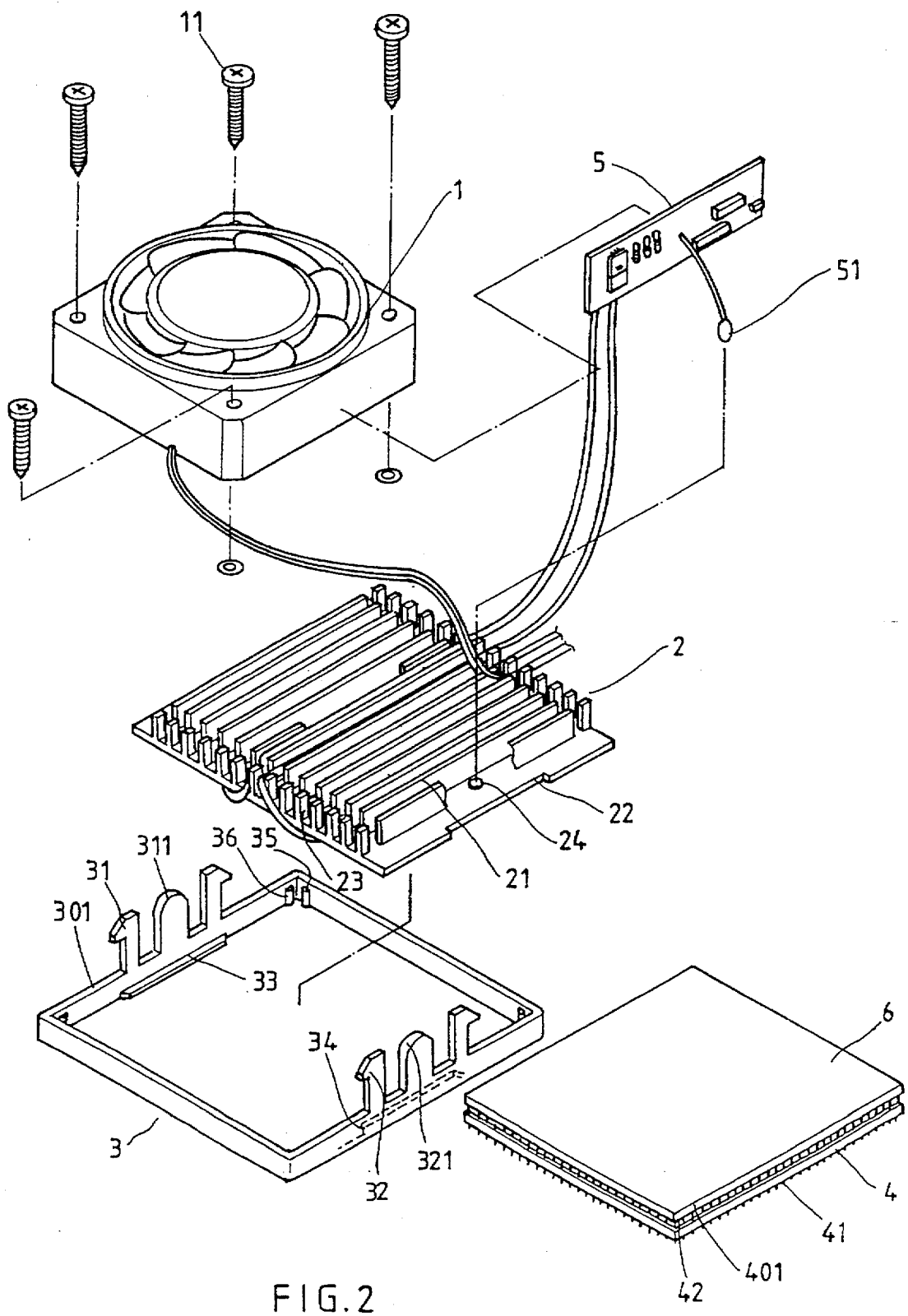
FIG. 2 is an exploded perspective view of a cooler made according to this invention.

Referring to the Figures, and particularly to FIG. 1 and 2, the thermostatically controlled cooler of this invention includes an electric fan 1, a heat exchange means 2, a supporting frame 3, a control circuit board 5 and a heat actuated cooling chip 6.

Said control circuit board 5 is attached on the side of said electrical fan 1.

A heat exchange means 2 is disposed under said electrical fan 1. Said heat exchange means 2 includes a plurality of fins 21 juxtaposed parallel with each other. The heat exchange means 2 further includes a fastening slot 22 at each side. The heat actuated cooling chip 6 is disposed thereunder.

The supporting frame 3 which has a rectangular shape has an inner configuration identical with the outer configuration of the CPU. A pair of hooks 31 and 32 are provided on either side. Supporting flanges 33 and 34 are disposed at the side flange 301 adjacent and beneath said pairs of hooks 31 and 32. A pair of ribs 35, 36 are provided at the corners of the supporting frame 3.

The central processing unit 4 has a positioning slot 42 between said CPU 4 and the pins 41. A thermostat 51 is attached to the controlling circuit board 6. By the provision of said supporting frame 3, said elements can be assembled into a cooler which can efficiently remove the heat generated by the CPU 4.

Figure 3:
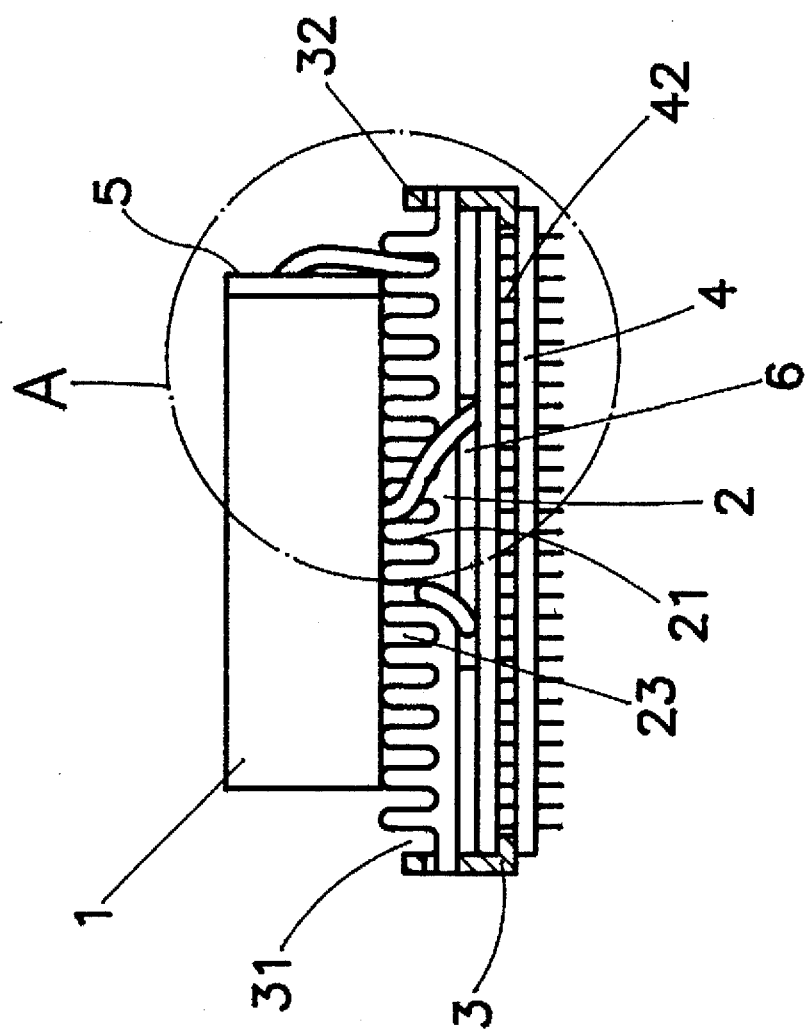
FIG. 3 is a side elevational view of a cooler made according to this invention.
Figure 3A:
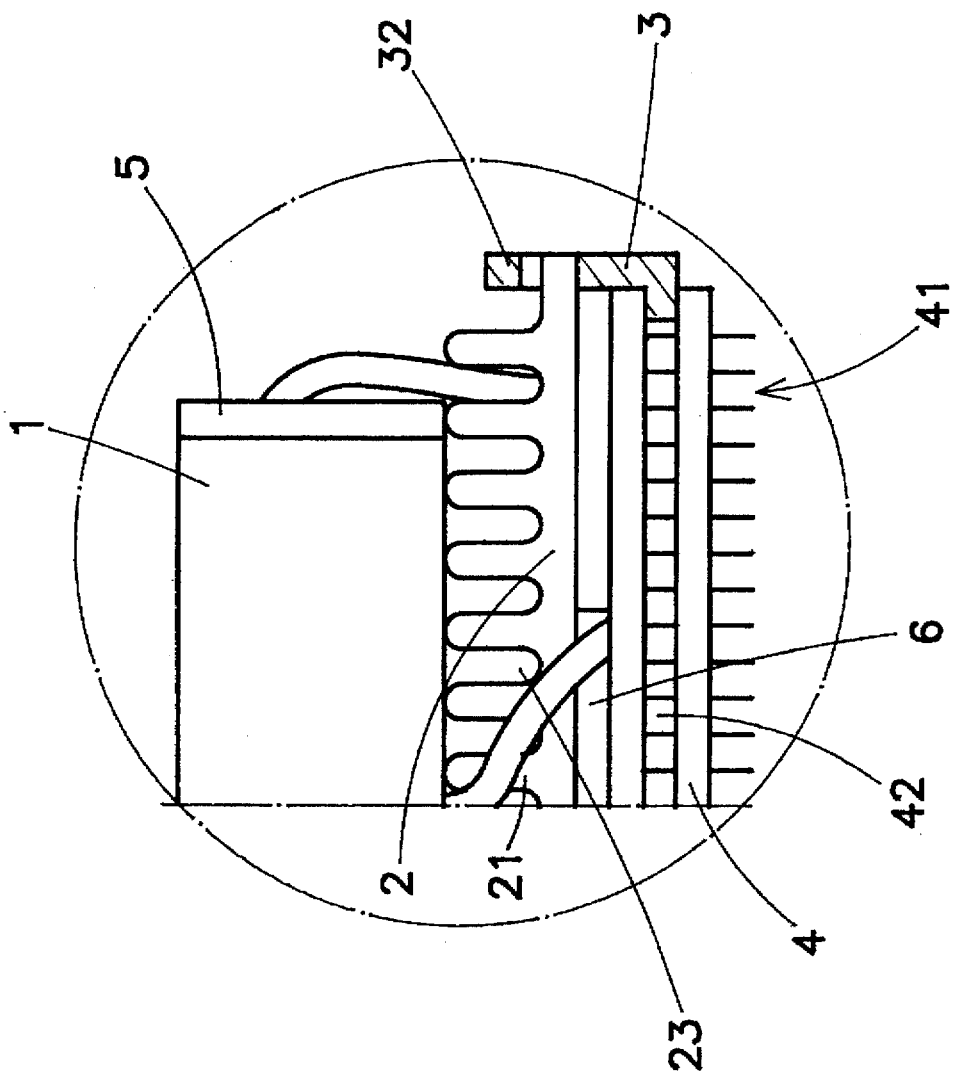
FIG. 3A is an enlarged view of detail A of FIG. 3.
Figure 4:
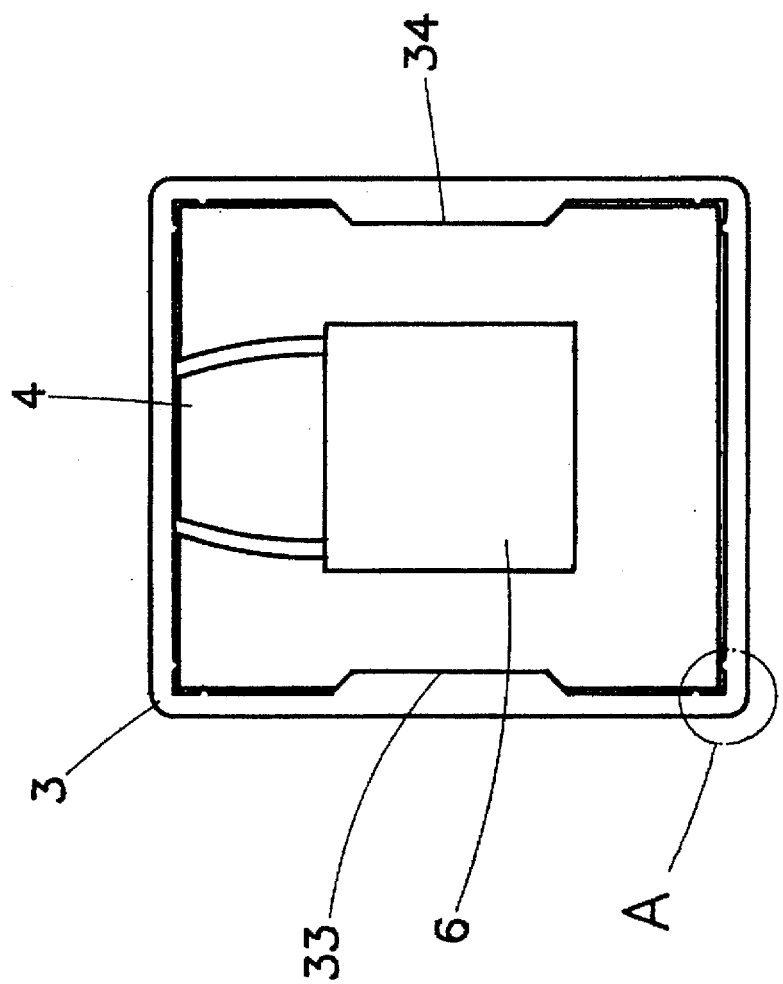
FIG. 4 is a bottom view of a heat exchange means of a cooler made according to this invention.
Figure 4A:
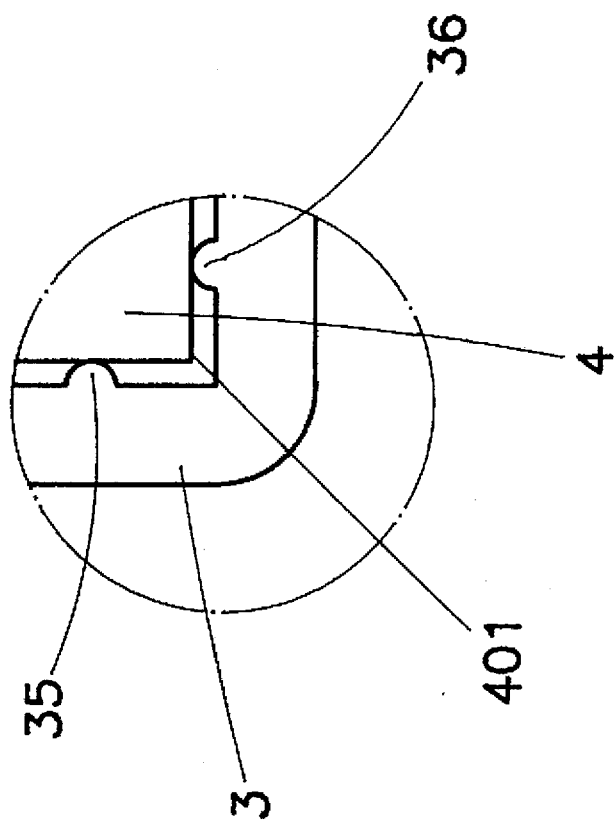
FIG. 4A is an enlarged view of detail A of FIG. 4.
Figure 5:
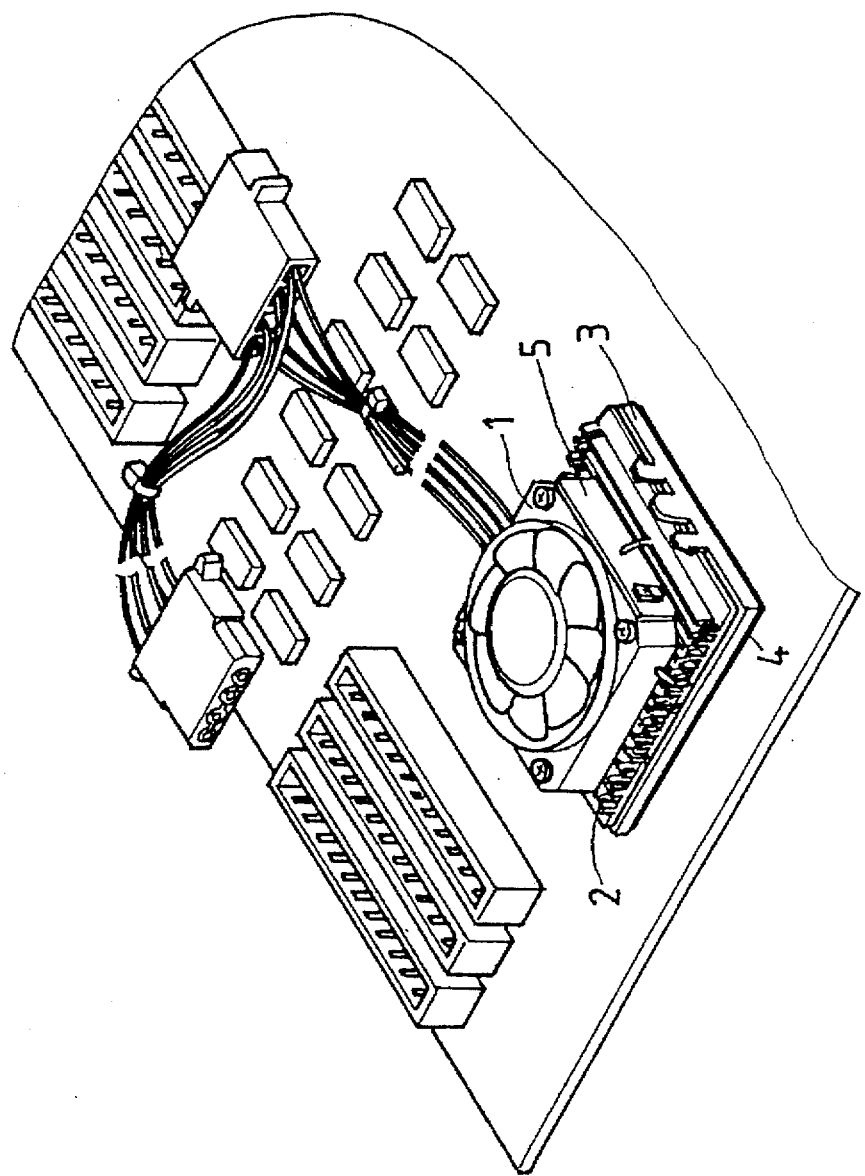
FIG. 5 is a sketch view of a cooler installed on a mother board.

Referring to FIGS. 2, 3 and 4, the supporting frame 3 is firstly mounted on the CPU 4 via an engagement between said positioning slot 42 and the supporting flanges 33 and 34. Then the heat exchange means 2 is disposed above the CPU 4 via an engagement between the hooks 31 and 32 and the fastening slot 22 of the heat exchange means 2. The heat actuated cooling chip 6 is sandwiched between the heat exchange means 2 and the CPU 4. Then the electrical fan 1 is attached to the heat exchange means 2 via a plurality of screws 11. Said screws 11 will extend into the space 23 defined by two adjacent fins 21. By this arrangement, heat will be removed by an air flow generated by said electric fan 1.

As described above, a controlling circuit board 5 is disposed on the outer wall of the electric fan 1. Thermostat 51 for said control circuit board 5 is positioned at a hole 24 on heat exchange means 2 to detect the temperature at CPU 4. Ribs 35 and 36 in the corners of said support the corners of heat exchange means 2, and electrical fan 1 will be mounted by screws 11 affixed thereto.

The cooler of this invention features a heat actuated cooling chip 6 and thermostat 51 in said control circuit board 5 which jointly detect the heat generated on said CPU 4. Said heat actuating cooling chip 6 provides excellent cooling ability by transferring heat generated from said CPU to said heat exchange means 2 efficiently. With the help of electric fan 1, heat is easily removed by the electric fan 1. If an extraordinary high heat is detected, a suitable warning means (not shown) can also be actuated.

Figure 6:
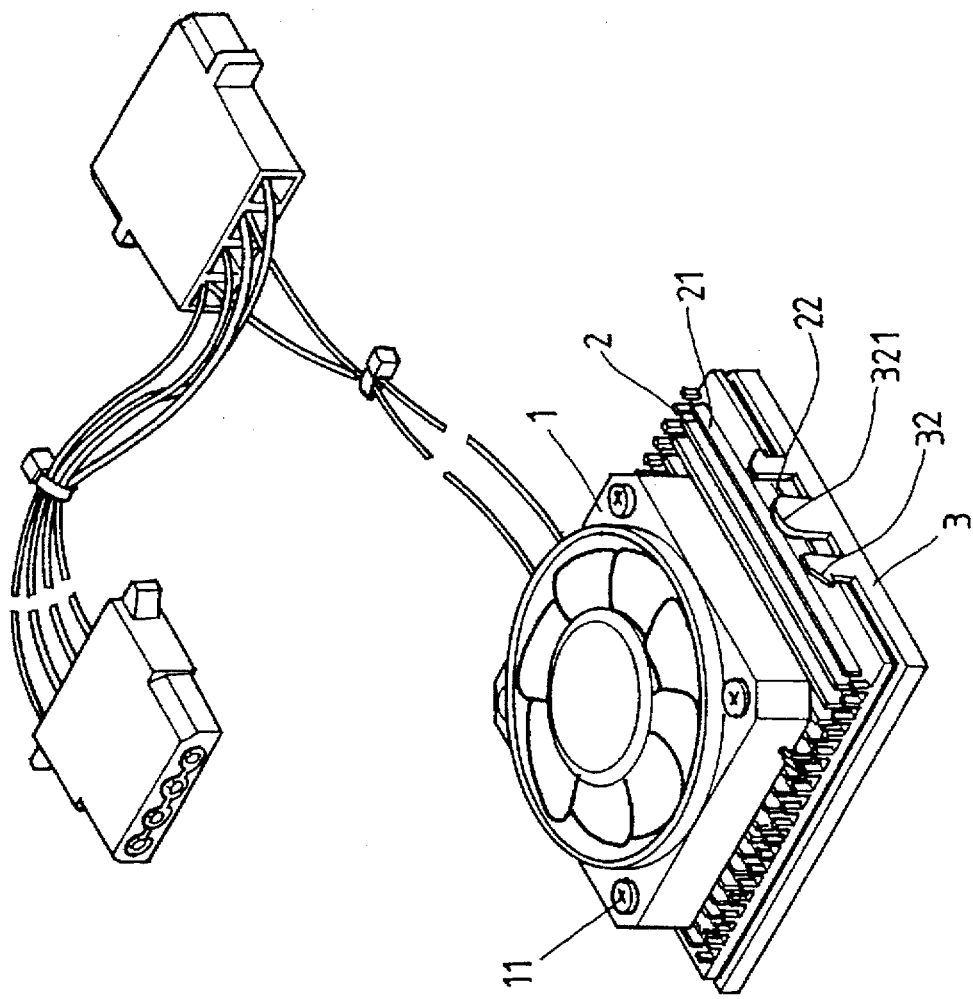
FIG. 6 is a perspective view of an alternative cooler together with its connecting wires.

In FIG. 6, the cooler made according to this invention includes a simplified embodiment of the controlling circuit board 5, and the heat actuating cooling chip 6. Only the electrical fan 1, the heat exchange means 2 and supporting frame 3 are provided.

Figure 7:
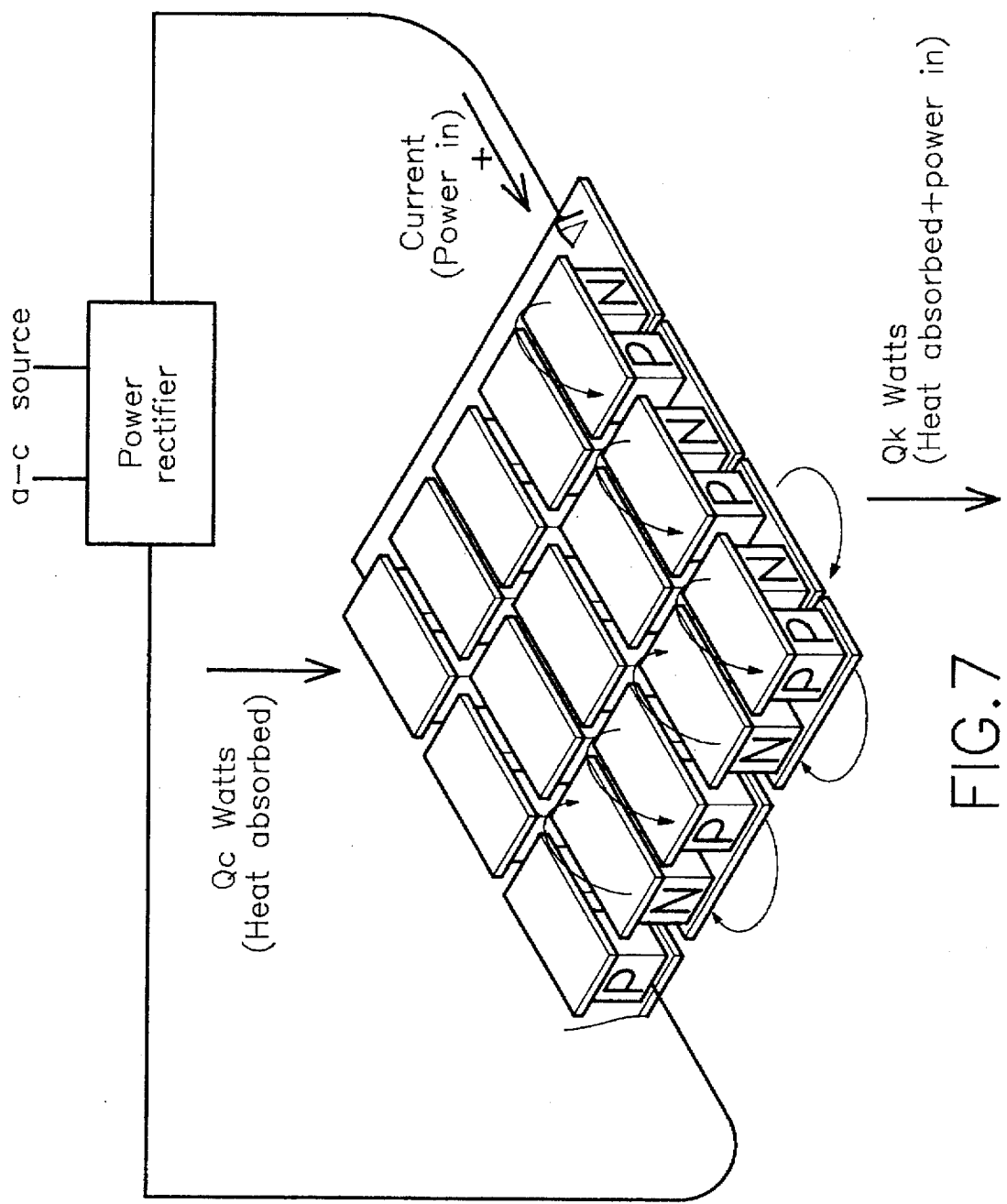
FIG. 7 is a schematic view of a thermal electric cooling apparatus.
Figure 8A:
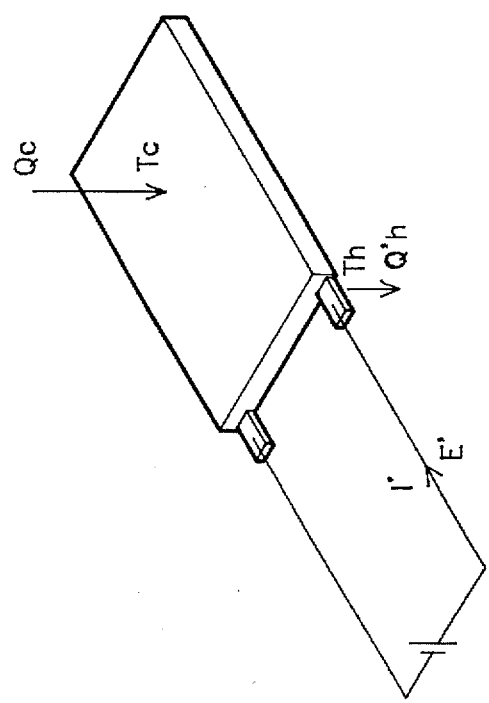
FIGS. 8A–D are schematic drawings of cooling chips.
Figure 8B:
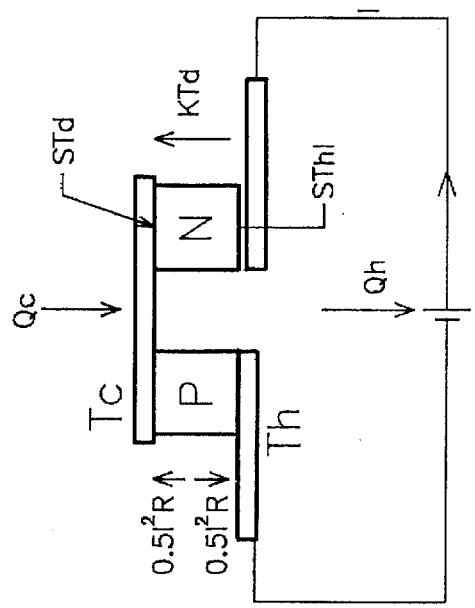
Figure 8C:
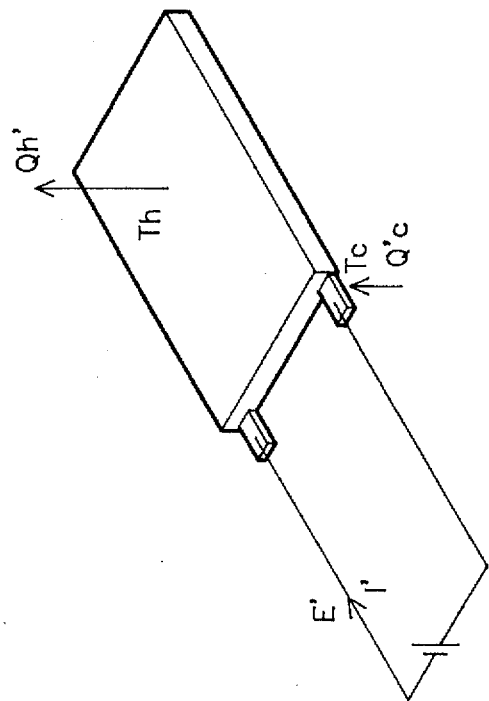
Figure 8D:
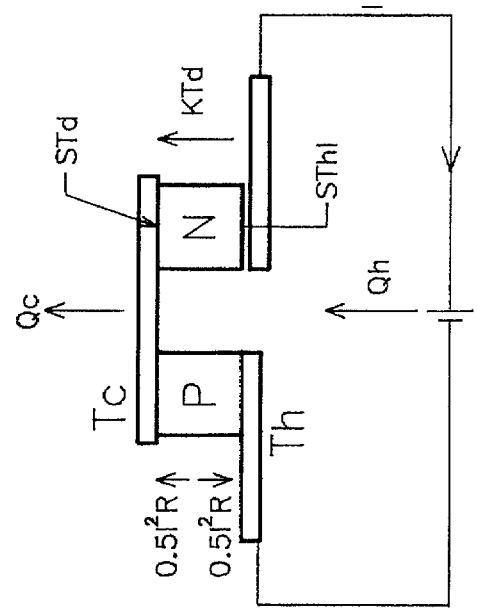
Figure 9:
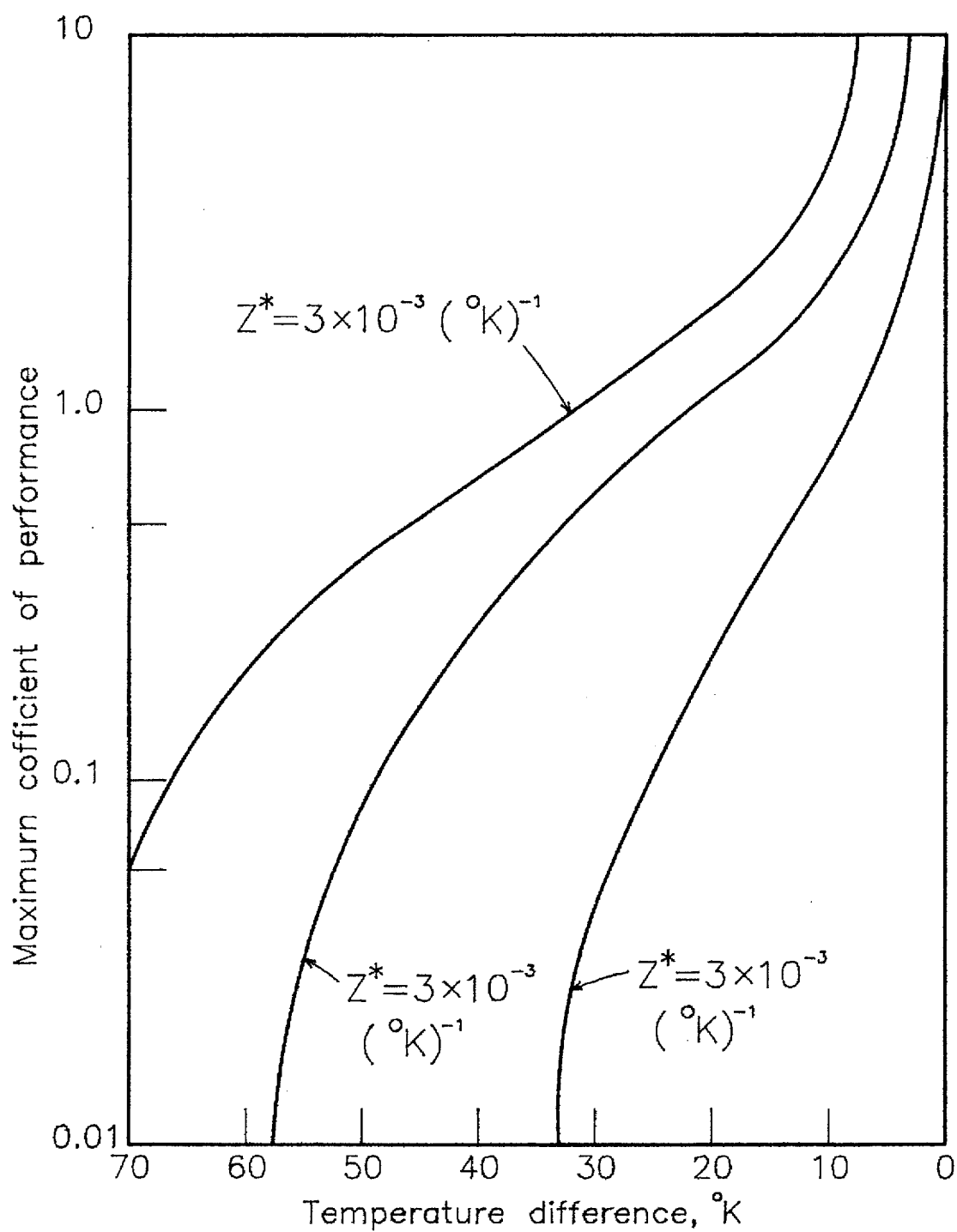
FIG. 9 is a graph depicting maximum coefficient of performance for a cooling chip as compared to temperature difference.

The term "cooling chip" as used herein refers to a thermal electric apparatus which uses N-type and P-type semiconductor elements. The elements are connected in an arrangement wherein the thermal passages are connected in parallel and the electric passages are in series as shown in FIG. 7.

The cooling effect in such a chip is the reversable physical phenomenon of power generation. The process of thermal electric cold coupling in a cooling chip produces a cooling effect when the electric power supply is inputted. Such a thermal electric cold coupling device is commonly known as a Peltier apparatus. The thermal electric cold coupling apparatus commonly comprises a power supply which provides a direct current input, a heat exchanger at the hot end to expel heat from the apparatus, and a heat exchanger at the cold end to absorb heat from the object to be cooled, thereby letting absorbed heat dissipate through a heat sink at the heat dissipating end of the apparatus. The movement of thermal current is determined by the direction of flow of the electrons of the inputted electric current. If the positions of the two opposite input and output terminals are reversed, the cold end becomes the hot end as shown in FIGS. 8A–D.

The measurement of the cooling effect of a thermal electric cold coupling apparatus is similar to that used in measuring regular air conditioners and freezers. A coefficient of performance (COP) is illustrated in FIG. 3 for different Z values of different materials at different temperatures. Regular commercially available thermo electric cold coupling Chips of average Z values of about $2.0 \times 10^{-3}$ (OK)–1 and exhibit a COP of about 0.3 at 40° C. While this performance is low in comparison with conventional freezers and air conditioners, a cold coupling apparatus because of its compact size is particularly useful according to this invention.

Although the present invention has been described in connection with the preferred embodiment thereof, many other variations and modifications will now become apparent to those skilled the art of without departing from the scope of the invention. It is preferred, therefore, that the present invention not be limited by the specific disclosure herein, but only by the appended claims.

I claim:

1. A thermostatically controlled cooler comprising: a supporting frame, a CPU and heat exchange means mounted on said supporting frame, said supporting frame being rectangular and further including a pair of ribs at each corner for supporting said CPU therein, said heat exchange means having a plurality of heat exchange fins thereof, a heat actuating cooling chip being disposed between said CPU and said heat exchange means, an electrical cooling fan being disposed above and mounted on said heat exchange fins, a control circuit being attached to said electrical cooling fan, a thermostat sensor being electrically connected to said control circuit, and being inserted into said heat exchange mean between an adjacent pair of said heat exchange fins whereby when the temperature sensed exceeds a preset value, said cooling fan will be actuated to remove the heat by ventilation.

2. A cooler as recited in claim 1, wherein said supporting frame further comprises a plurality of positioning slots and supporting flanges and said CPU is mounted between said positioning slots and said supporting flanges.

3. A cooler as recited in claim 1, wherein said fan is mounted on said fins by a plurality of screws.

* * * * *